(12) United States Patent
Lee (10) Patent No.: US 8,027,201 B2
(45) Date of Patent: Sep. 27, 2011

(54) NONVOLATILE MEMORY DEVICE WITH LOAD-FREE WIRED-OR STRUCTURE AND AN ASSOCIATED DRIVING METHOD

(75) Inventor: Seung-Jae Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 71 days.

(21) Appl. No.: 12/371,390

(22) Filed: Feb. 13, 2009

(65) Prior Publication Data

US 2009/0190412 A1   Jul. 30, 2009

Related U.S. Application Data

(62) Division of application No. 11/319,324, filed on Dec. 27, 2005, now Pat. No. 7,512,020.

(30) Foreign Application Priority Data

Jan. 10, 2005  (KR) .................. 10-2005-0002192

(51) Int. Cl.
    *G11C 11/34* (2006.01)
(52) U.S. Cl. .......... 365/185.21; 365/185.17; 365/185.22
(58) Field of Classification Search ............. 365/185.21, 365/185.17, 185.22
    See application file for complete search history.

(56) References Cited

U.S. PATENT DOCUMENTS

| | | | |
|---|---|---|---|
| 6,172,921 B1 | 1/2001 | Park et al. | |
| 6,233,183 B1 | 5/2001 | Kim et al. | |
| 6,556,479 B2 | 4/2003 | Wada et al. | |
| 6,671,204 B2 | 12/2003 | Im | |
| 6,711,087 B2 | 3/2004 | Afghahi et al. | |
| 6,717,857 B2 * | 4/2004 | Byeon et al. | 365/185.21 |
| 6,813,184 B2 | 11/2004 | Lee | |
| 7,027,330 B2 | 4/2006 | Park | |
| 7,054,206 B2 | 5/2006 | Tellier | |
| 7,110,294 B2 | 9/2006 | Kawai | |
| 7,154,784 B2 | 12/2006 | Lee | |
| 7,286,400 B2 | 10/2007 | Kojima et al. | |
| 7,379,333 B2 | 5/2008 | Lee et al. | |
| 2003/0016562 A1 | 1/2003 | Im | |
| 2004/0165472 A1 | 8/2004 | Yamazaki | |
| 2005/0152188 A1 | 7/2005 | Ju | |
| 2006/0007774 A1 | 1/2006 | Zanardi et al. | |
| 2006/0133144 A1 | 6/2006 | Lee et al. | |
| 2006/0181928 A1 | 8/2006 | Lee et al. | |

FOREIGN PATENT DOCUMENTS

JP         04-267698        9/1992
(Continued)

OTHER PUBLICATIONS

English language abstract of Korean Publication No. 2003-0061877.
English language abstract of Korean Publication No. 2004-0050697.

(Continued)

*Primary Examiner* — Jason Lappas
(74) *Attorney, Agent, or Firm* — Volentine & Whitt, PLLC (57) ABSTRACT

A nonvolatile semiconductor memory device includes an internal output line, and a page buffers. Each page buffer is coupled to at least one bitline, the internal output line, and a data input line physically distinct from the internal output line, and configured to pull the internal output line to an output drive voltage in response to a bitline voltage on one of the bitlines coupled to the page buffer.

12 Claims, 13 Drawing Sheets

FOREIGN PATENT DOCUMENTS

| | | |
|---|---|---|
| JP | 07-307098 | 11/1995 |
| JP | 10-208494 | 8/1998 |
| JP | 11-203879 | 7/1999 |
| KR | 2003-0061877 | 7/2003 |
| KR | 2004-0050697 | 6/2004 |

OTHER PUBLICATIONS

English language abstract of Japanese Publication No. 04-267698.
English language abstract of Japanese Publication No. 10-208494.
English language abstract of Japanese Publication No. 11-203879.

* cited by examiner

NONVOLATILE MEMORY DEVICE WITH LOAD-FREE WIRED-OR STRUCTURE AND AN ASSOCIATED DRIVING METHOD

CROSS REFERENCE TO RELATED APPLICATION

This application is a Divisional of U.S. patent application Ser. No. 11/319,324, filed on Dec. 27, 2005, which claims priority under 35 U.S.C. §119 from Korean Patent Application No. 2005-0002192 filed on Jan. 10, 2005, in the Korean Intellectual Property Office, the entire contents of which are hereby incorporated by reference

BACKGROUND

This disclosure relates to a nonvolatile semiconductor memory device and especially, to a nonvolatile memory device with a wired-OR structure and an associated driving method.

Programming or reading data from memory cells in a nonvolatile semiconductor memory device typically requires controlling a bitline voltage corresponding to a selected memory cell. For controlling the bitline, the nonvolatile memory device includes a page buffer to store the read out and/or program data bit.

Figure 1:
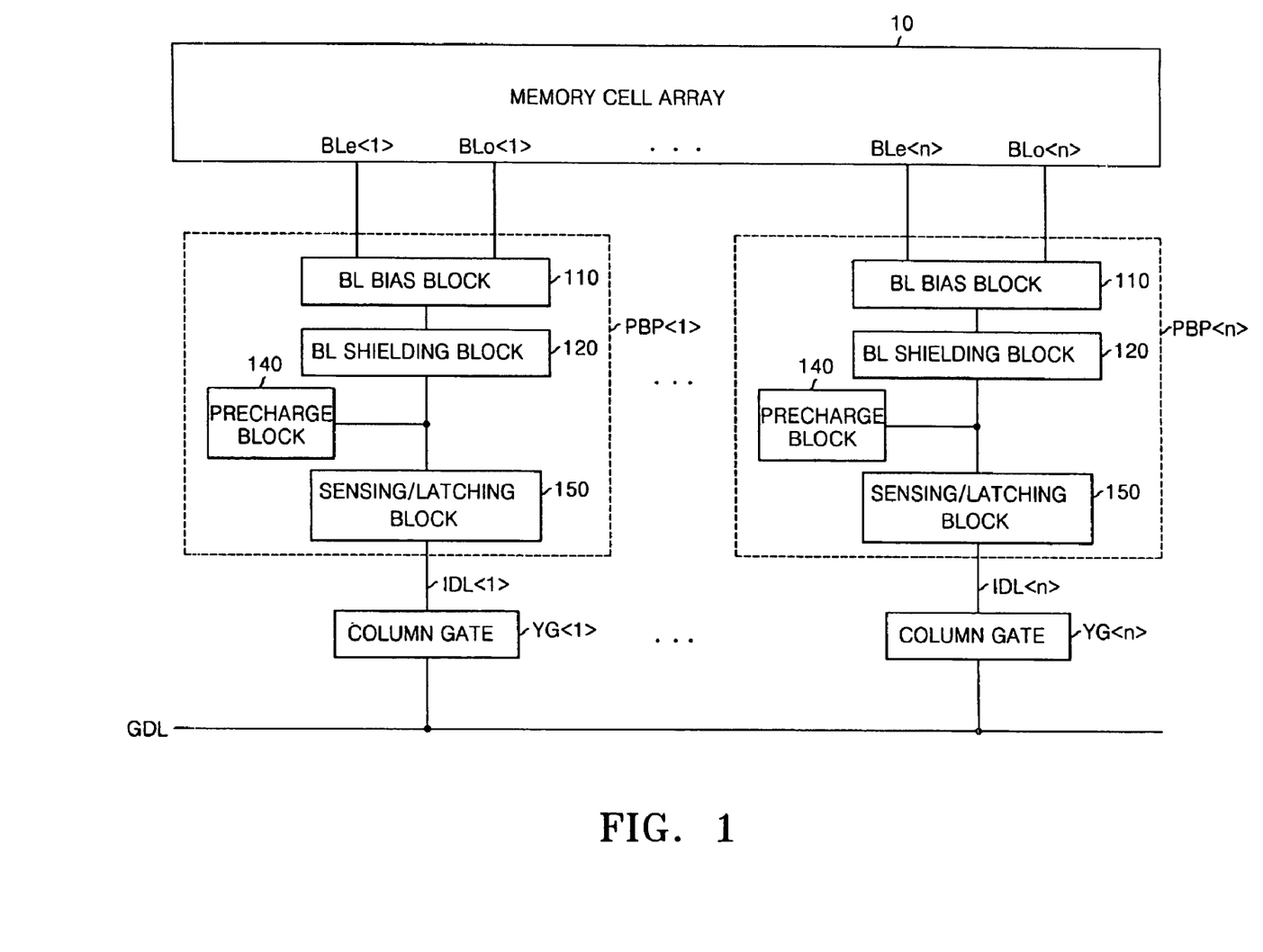
FIG. 1 is a block diagram of a conventional nonvolatile memory device.
Figure 2:
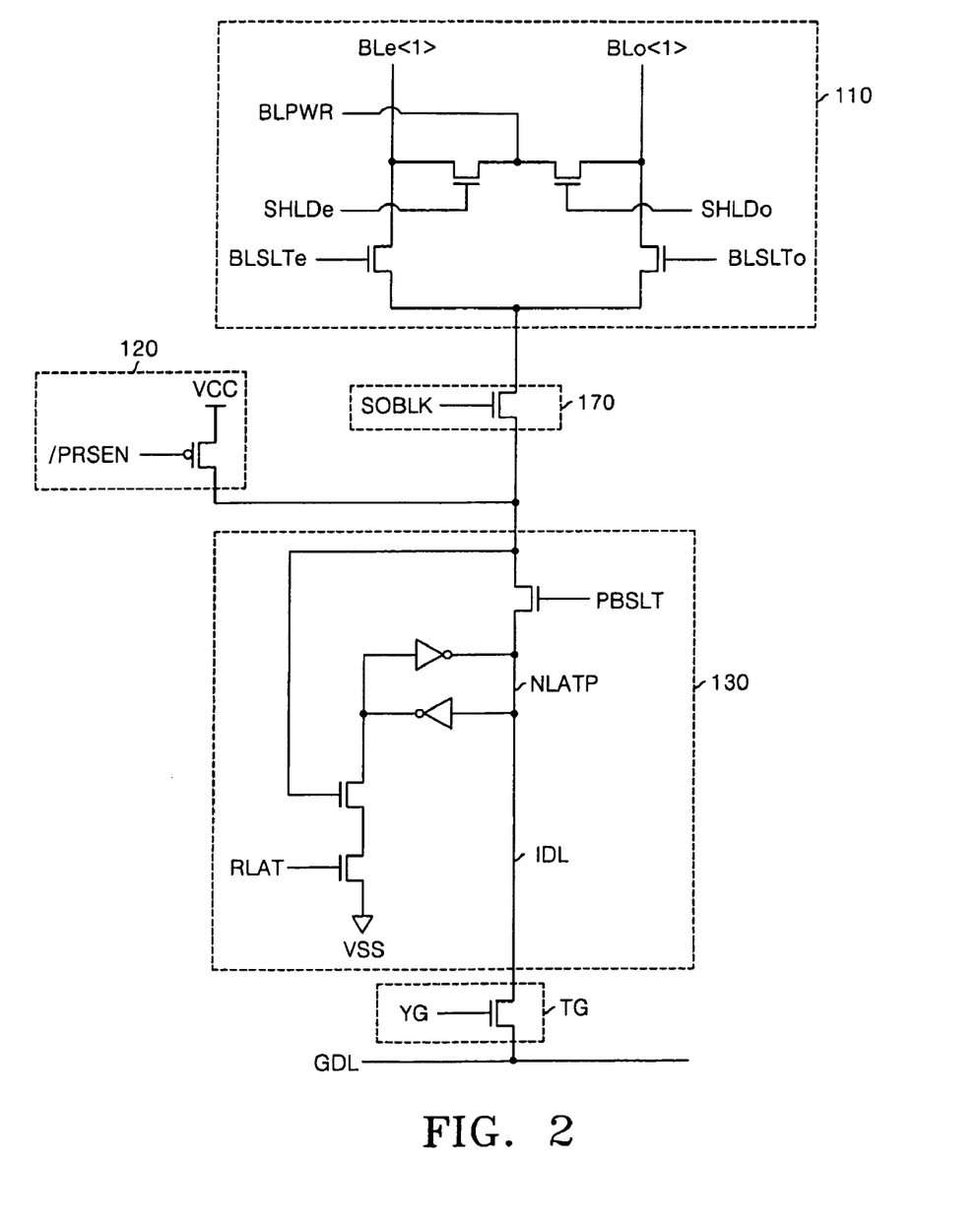
FIG. 2 is a circuit diagram of a column gate corresponding to one of page buffers shown in FIG. 1.

FIG. 1 is a block diagram of a conventional nonvolatile memory device including a page buffer. FIG. 2 illustrates a column gate YG (one of YG<1>~YG<n>) and a corresponding one of page buffers PBP (one of PBP<1>~PBP<n>) as shown in FIG. 1. In the conventional page buffer PBP, a data bit written into a memory cell is loaded and stored in a sensing/latching block 150. The data bit held in the sensing/latching block 150 is transferred to a bitline BLe or BLo and programmed in a selected memory cell. A data bit corresponding to a data bit read out from a memory cell is also temporarily stored in the sensing/latching block 150. Responding to one of the column gating signals Ya<1:n>, the stored data bit stored is transferred to a global data line GDL.

In the conventional nonvolatile memory device, as shown in FIGS. 1 and 2, internal data lines IDL of the page buffers PBP are commonly connected to the global data line GDL through their corresponding column gates YG. The data path from the global data line GDL to a sensing/latching node NLATP is commonly used by a data bit during programming and reading operations. Data stored in the sensing/latching node NLATP may flip, change, or otherwise corrupt due to a charge sharing between the global data line GDL and the internal data line IDL.

A program verifying operation for the conventional nonvolatile memory device serially or sequentially confirms each of the data bits in programmed memory cells. Thus, the conventional nonvolatile memory device therefore has an unnecessarily lengthy program data verifying operation.

SUMMARY

An embodiment includes a nonvolatile semiconductor memory device includes an internal output line, and a page buffers. Each page buffer is coupled to at least one bitline, the internal output line, and a data input line physically distinct from the internal output line, and configured to pull the internal output line to an output drive voltage in response to a bitline voltage on one of the bitlines coupled to the page buffer.

A further embodiment includes a method of operating a semiconductor memory device including comparing each bitline voltage with a respective precharge voltage, combining the comparisons, and indicating a failure to program in response to the combination.

BRIEF DRAWING DESCRIPTION

We include the accompanying drawings to provide an understanding of the device and method we describe below. The drawings illustrate example embodiments.

DETAILED DESCRIPTION

We describe preferred embodiments in detail with reference to the accompanying drawings. Other embodiments may, however, be in different forms and should not be construed as limited to the embodiments set forth here. We provide these embodiments so that this disclosure will be thorough and complete, and will fully convey the scope we intend to those skilled in the art. Like numerals refer to like elements throughout the specification.

Described is a structure where two adjacent bitlines form a pair of bitlines. An embodiment may, however, include a structure where each bitline is selected by a corresponding column address, as well as a structure where each bitline pair selected by a corresponding column address. In this description, the bitline may be referred to just as "bitline" without differentiating adjacent bitlines or even and odd bitlines.

Figure 3:
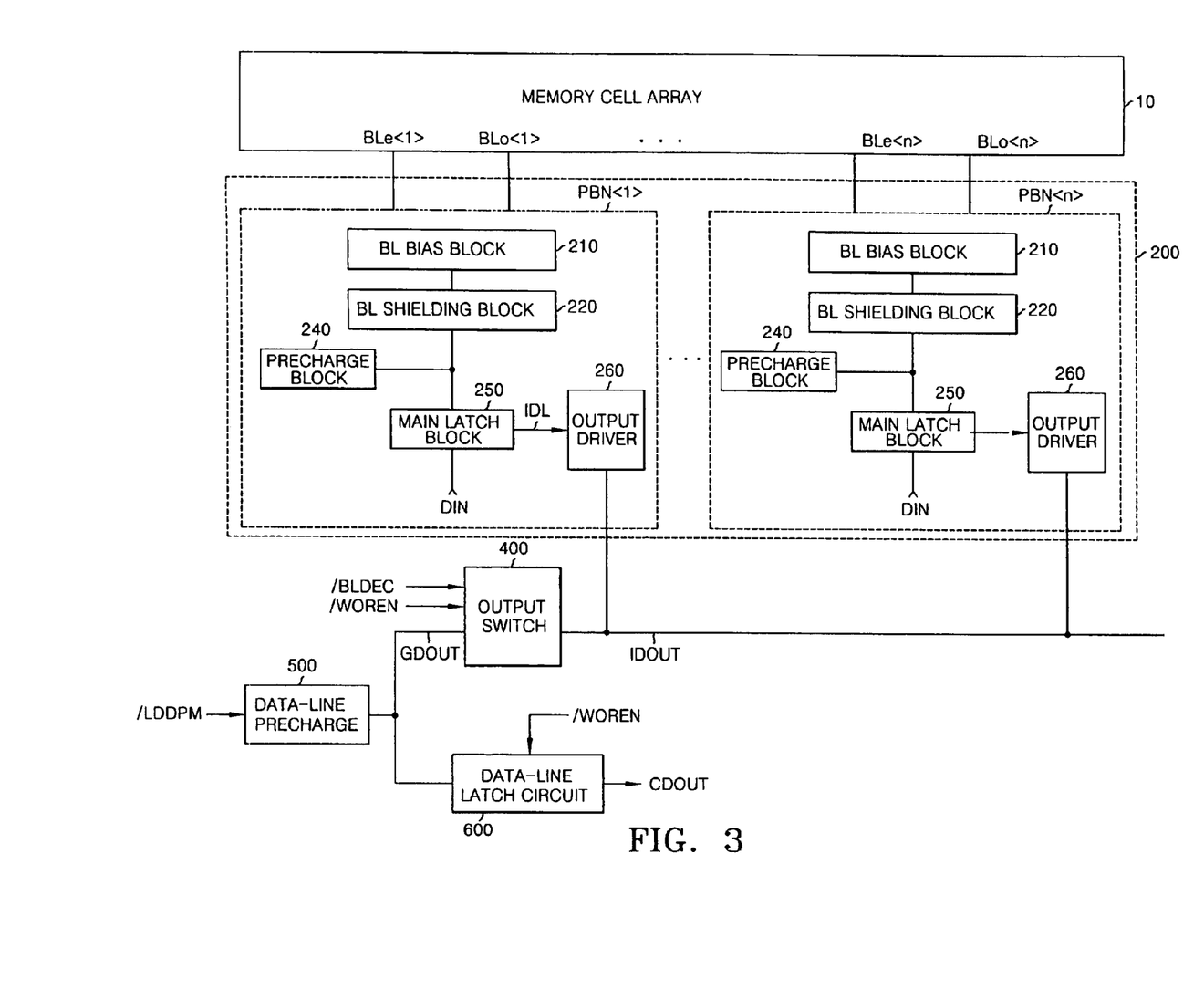
FIG. 3 is a block diagram of an embodiment of a nonvolatile memory device.

FIG. 3 illustrates a nonvolatile semiconductor memory device. Referring to FIG. 3, the nonvolatile semiconductor memory device includes a memory cell array 10, a page buffer circuit 200, an output switch circuit 400, a data line pre-charge circuit 500, and a data line latch circuit 600.

The memory cell array 10 includes even bitlines BLe<1:n>, and odd bitlines BLo<1:n>. Together they form corresponding pairs of even and odd bitlines. The cell array 10 includes memory cells for storing data by program operations in correspondence with the even and odd bitlines BLe<1:n> and BLo<1:n>. The memory cell array 10 is shown in more detail in FIG. 4.

Figure 4:
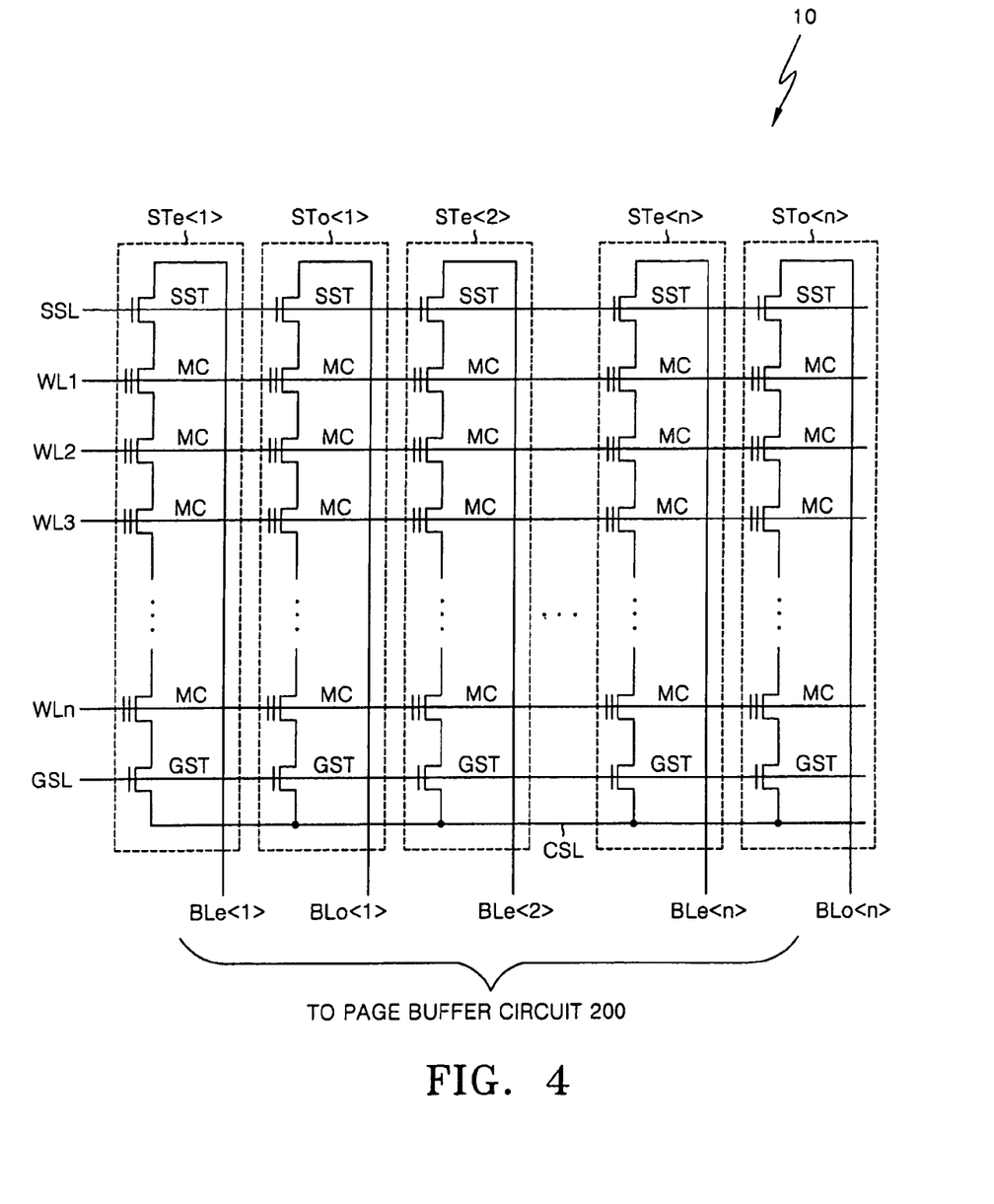
FIG. 4 is a circuit diagram of the memory cell array shown in FIG. 3.

Referring to FIG. 4, the memory cell array 10 includes even and odd cell strings STe<1:n> and STo<1:n>, each connected to their corresponding even and odd bitlines, BLe and BLo. Each cell string, in turn, includes a string selection transistor SST, a ground selection transistor GST connected to a common source line CSL, and memory cells MC serially connected between the string selection transistor SST and the ground selection transistor GST. The bitlines BLe<1:n> and BLo<1:n> are electrically connected to the page buffer circuit 200.

Each of the memory cells MC may be formed of a floating gate transistor constructed of a source, a drain, a floating gate, and a control gate. Ways to program the memory cell MC include taking advantage of the channel hot electron effect (CHE) or Fowler-Nordheim tunneling (F-N). The memory cell may be programmed to a voltage level of an associated bitline among the even and odd bitlines BLe<1:n> and BLo<1:n>.

Returning to FIG. 3, the page buffer circuit 200 includes page buffers PBN<1:n> arranged corresponding to pairs of even and odd bitlines BLe<1:n> and BLo<1:n>. All page buffers in the page buffer circuit 200 may be constructed in the same or similar structure, and may be coupled to a corresponding even and odd bitline pair of BLe<1:n> and BLo<1:n>. Thus, in this specification, we will be describing a single page buffer with the reference numeral PBN and an even and odd bitline pair respectively referred to as BLe and BLo as a representative example.

Figure 5:
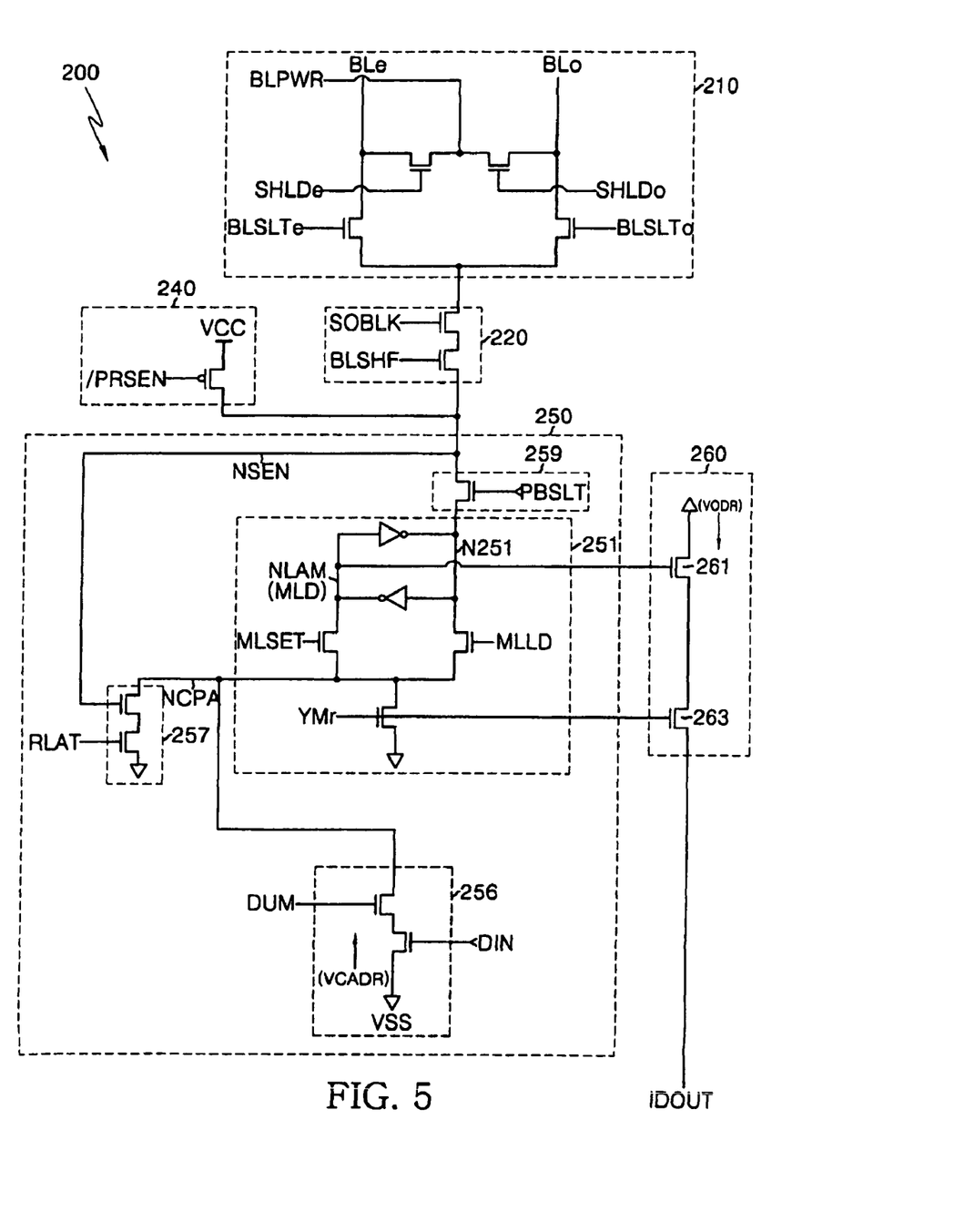
FIG. 5 is a circuit diagram of the page buffer shown in FIG. 3.

FIG. 5 is a circuit diagram of the page buffer PBN shown in FIG. 3. The page buffer PBN stores a data bit for the corresponding bitline pair BLe and BLo at a main latch node NLAM. In this specification we will refer to a data bit held at the main latch node NLAM as the main latch data bit MLD. Referring to FIG. 5, the page buffer PBN includes a bitline bias block 210, a bitline shielding block 220, a precharge block 240, a main latch block 250, and an output driver 260.

The bitline bias block 210 selects one of two bitlines BLe and BLo forming its corresponding bitline pair, controlling a bias voltage thereof. The bitline shielding block 220 controls connection between the selected bitline BLe or BLo and a sensing node NSEN. The precharge block 240 charges the sensing node NSEN of the main latch block 250 up to a power source voltage in response to a sensing precharge signal /PRSEN. Such a voltage may be referred to as a precharge voltage.

The structure and operation of the bitline bias block 210, the bitline shielding block 220, and the precharge block 240 may be understood by those skilled in the art with reference to FIG. 5. We will not discuss these blocks in any more detail.

The main latch block 250 includes the main latch node NLAM. The main latch data bit MLD stored at the main latch node NLAM may be supplied in various ways. In this embodiment, a logical state of the main latch data MLD depends on a voltage of a corresponding transfer node NCPA during a data program mode. The voltage of the responding transfer mode NCPA may be controlled by a cache latch data bit CLD having a logical state corresponding to an input data bit on data input line DIN. As a result, a logical state of the main latch data bit MLD is determined by providing input data during the data program mode.

To summarize, when the selected bitline BLe or BLo is in a programmable state, i.e., a ground voltage VSS, the main latch data bit MLD is set to logic "H." Otherwise, when the selected bitline BLe or BLo is in a program-inhibit state, the main latch data bit MLD is set on logic "L."

The output driver 260 may pull an internal output line IDOUT to an output drive voltage VODR in response to the main latch data bit MLD. In other words, the internal output line IDOUT may be pulled to an output drive voltage VODR (the ground voltage VSS in this embodiment) if the main latch data MLD has a logic "H."

The internal output line IDOUT is coupled to the output switch circuit 400 of FIG. 3. The internal output line IDOUT is physically distinct from a data input line DIN to the main latch node NLAM, electrically isolating the internal output line IDOUT from the data input line DIN. Thus, a logic state of the main latch data bit MLD is independent of variations of a voltage level on the internal output line IDOUT.

In more detail, the internal output line IDOUT may be pulled to VODR in response to the main latch data bit MLD of each of the page buffers PBN<1:n> of FIG. 3. If any of the main latch data bits MLD from the page buffers PBN<1:n> has a logical state of a logic "H", the internal output line IDOUT is pulled to VODR. The internal output line IDOUT may be coupled to a global output line GDOUT. If so, the global output line GDOUT is pulled to VODR. Thus, the global output line GDOUT may be pulled to VODR even though all logic states of the main latch data bits MLD from the other page buffers are at a logic "L."

Thus, it is possible to implement a wired-OR structure using the output driver 260 in the nonvolatile semiconductor memory device including the page buffers PBN<1:n>. By executing a verifying operation simultaneously using the main latch data bits MLD, it is possible to determine whether memory cells connected to the page buffers PBN<1:n> have been successfully programmed, and the time consumed in verifying a program state is reduced.

Referring back to FIG. 5, we will describe in detail the main latch block 250 and the output driver 260.

The main latch block 250 includes the sensing node NSEN, a main latch circuit 251, a cache dumping circuit 256, a sense responding circuit 257, and a buffer selection circuit 259. The sensing node NSEN is electrically coupled to a selected bitline BLe or BLo through the bitline shielding block 220.

The main latch circuit 251 includes the main latch node NLAM. The main latch node NLAM stores a data bit as the main latch data bit MLD corresponding to a logic state of the corresponding transfer node NCPA.

The cache dumping circuit 256 responds to a predetermined dumping control signal DUM, applying a cache drive voltage VCADR to the responding transfer node NCPA according to the cache latch data CLD on a data input line DIN.

The sense responding circuit 257 responds to a logical state of the sensing node NSEN and a predetermined logic state of a read latch signal RLAT, providing a sense responding voltage (i.e., the ground voltage VSS in this embodiment) to the sense responding node NCPA. The buffer selection circuit 259 transfers a data bit to the selected bitline BLe or BLo by way of the sensing node NSEN corresponding to the main latch data bit MLD.

The output driver 260 activates the internal output line IDOUT in response to the main latch data bit MLD during a data read mode. Preferably, the output driver 260 includes a first output driving transistor 261 and a second output driving transistor 263. The first output driving transistor 261 is gated by the main latch data bit MLD. In operation, the first output driving transistor 261 is turned on when the main latch data bit MLD is at a logic "H." The second output driving transistor 263 is gated by a main latch selection address YMr. If both the first output driving transistor 261 and the second output driving transistor 263 are turned on, the internal output line IDOUT is pulled to the voltage VODR.

Thus, when the main latch data bit MLD has a logic "H," the internal output line IDOUT is driven into the voltage VODR when the main latch selection address YMr transitions to logic "H".

Returning to FIG. 3, the nonvolatile semiconductor memory device also includes an output switch circuit 400. The output switch circuit 400 connects the internal output IDOUT with the global output line GDOUT, in response to a wired-OR enable signal /WOREN and a block decoding signal /BLDEC. Here, the wired-OR enable signal /WOREN is active in logic "L" during a wired-OR operation that confirms all data supplied from the page buffers connected to the internal output line IDOUT. The block decoding signal /BLDEC is a signal specifying the internal output line IDOUT. In other words, the block decoding signal /BLDEC is an address signal designating the page buffers connected to the internal output line IDOUT from the page buffer circuit 200 of FIG. 3.

The output switch circuit 400, therefore, electrically connects the internal output line IDOUT to the global output line GDOUT during the wired-OR mode or when the page buffer circuit 200 is selected by the block decoding signal /BLDEC.

Figure 6:
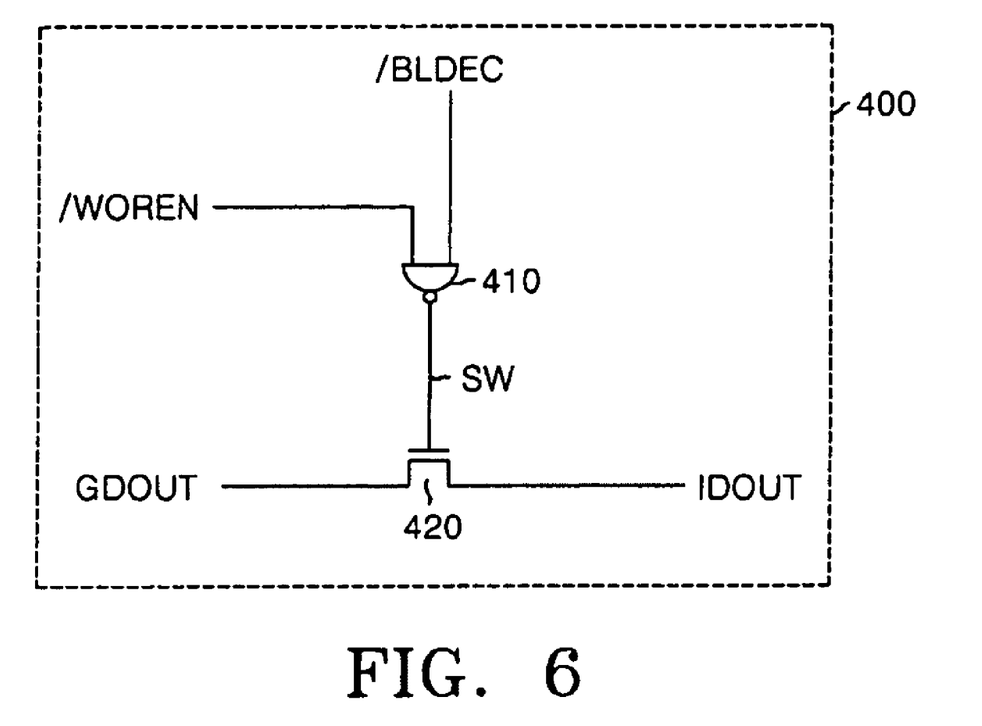
FIG. 6 is a circuit diagram of the output switch shown in FIG. 3.

FIG. 6 illustrates an example of the output switch circuit 400 of FIG. 3 in detail. Referring to FIG. 6, the output switch circuit 400 comprises a switch logic gate 410 and a switch transistor 420. The switch logic gate 410 logically manipulates the block decoding signal /BLDEC and the wired-OR enable signal /WOREN, generating a switch control signal SW that controls the switch transistor 420.

In an embodiment, the switch transistor 420 transfers a data bit from the internal output line IDOUT to the global output line GDOUT when the block decoding signal /BLDEC or the wired-OR enable signal /WOREN is activated with logic "L."

Returning to FIG. 3, the nonvolatile semiconductor memory device includes a data line pre-charge circuit 500. The data line pre-charge circuit 500 pre-charges the global output line GDOUT for a constant time, before the internal output line IDOUT is electrically connected to the global output line GDOUT, in the wired-OR operation.

Figure 7:
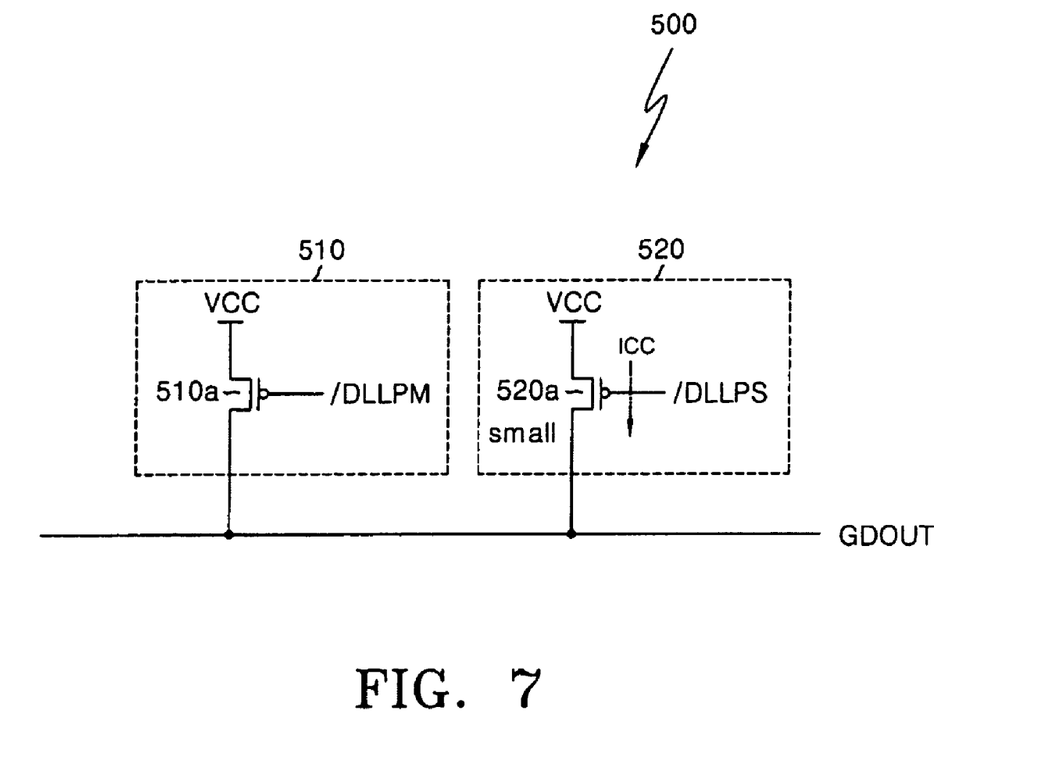
FIG. 7 is a circuit diagram of the data line pre-charge circuit shown in FIG. 3.
Figure 8:
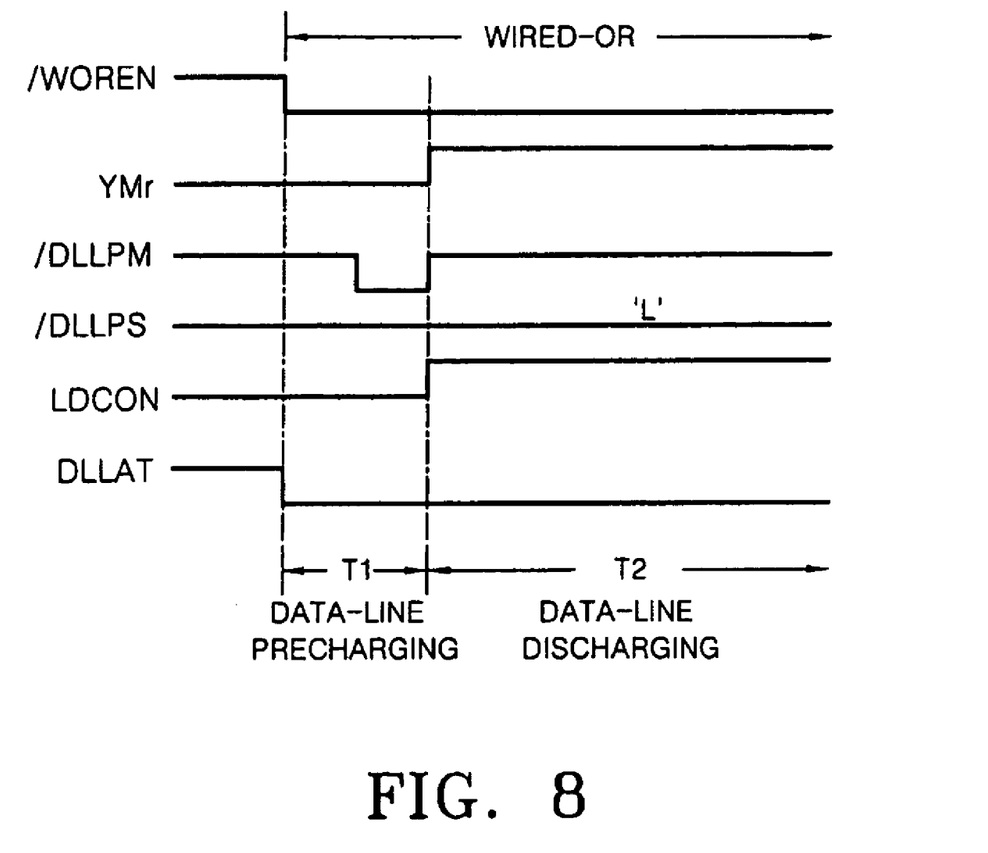
FIG. 8 is a timing diagram of signals and voltages at nodes in the data line pre-charge circuit of FIG. 7.

FIG. 7 illustrates an example of the data line pre-charge circuit 500 of FIG. 3. FIG. 8 is a timing diagram illustrating waveforms of voltages at the nodes and signals during the wired-ORing mode. Referring to FIG. 7, the data line pre-charge circuit 500 includes a data line pre-charge block 510.

The data line pre-charge block 510 pre-charges the global output line GDOUT to the power voltage VCC for the wired-OR mode. Preferably, the data line pre-charge block 510 includes a PMOS transistor 510a for pre-charging the global output line GDOUT in response to a data line pre-charge signal /DLLPM.

The data line pre-charge signal /DLLPM is at a logic "L" during a portion of a data line pre-charge period T1 shown in FIG. 8. Thus, the global output line GDOUT is pre-charged to the power voltage VCC in the data line pre-charge period T1.

The data line pre-charge signal /DLLPM is at a logic "H" during a data line discharge period T2 shown in FIG. 8. The global output line GDOUT is controlled to the ground voltage VSS or the power voltage due to the main latch data line MLD.

Returning to FIG. 7, the load supply block 520 supplies the charge current ICC to the global output line GDOUT when the internal output line IDOUT is conductive corresponding to the main latch data MLD. The load supply block 520 may include a second PMOS transistor 520a gated by the data line loading signal /DLLPS. The charge current ICC flows into the global output line GDOUT through the load supply block 520, to compensate the leakage current into the global output line GDOUT. In this embodiment, the electrical conductivity of the second PMOS transistor 520a is smaller than that of the first PMOS transistor 510a.

The wired-OR operation first proceeds in a pre-charge period T1 to pre-charge the global output line GDOUT to the power voltage VCC. During data line discharge period T2, the pre-charged global output line GDOUT is discharged in response to the main latch data MLD in the page buffer PBN.

Thus, after pre-charging the global data line GDOUT, the wired-OR operation discharges the global output line GDOUT in response to the main latch data bit MLD of the main latch block 250 shown in FIG. 5 (in this embodiment, referred to as 'load free scheme').

Returning to FIG. 3, the nonvolatile semiconductor memory device also includes the data line latch circuit 600. The data line latch circuit 600 temporarily stores a data bit of the global output line GDOUT and transfers the data bit to a common output line CDOUT from the global output line GDOUT.

Figure 9:
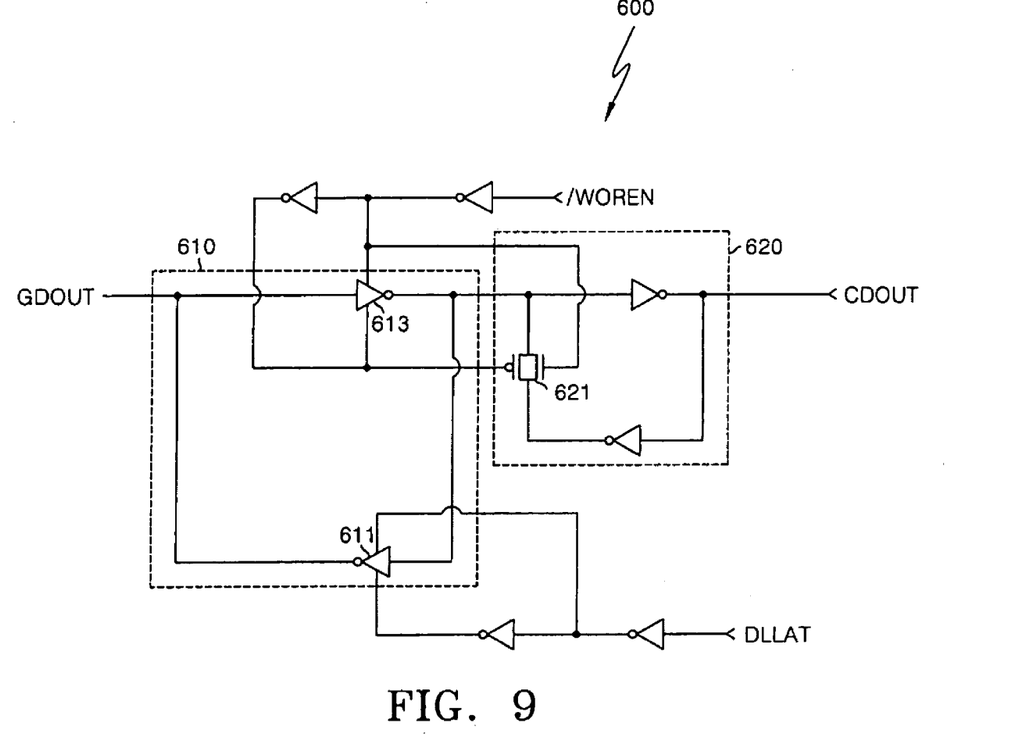
FIG. 9 is a detailed circuit diagram of the data latch circuit shown in FIG. 3.

FIG. 9 illustrates the data line latch circuit 600 of FIG. 3 in detail. Referring to FIG. 9, the data line latch circuit 600 includes a global-line latch block 610 and a common latch block 620.

The global-line latch block 610 holds (or latches) a data bit of the global output line GDOUT responsive to a data latch signal DLLAT. The data latch signal DLLAT is at a logic "L" during the wired-OR mode. An inverter 611 is disabled to release the latching state for the global output line GDOUT. Further, the global-line latch block 610 transfers a data bit from the global output line GDOUT to the common output line CDOUT in response to the wired-OR enable signal /WOREN. The wired-OR enable signal /WOREN is set on logic "L" in the wired-OR period. When /WOREN is a logic "L," an inverter 613 is disabled to cut off the transfer of data toward the common output line CDOUT.

The common latch block 620 temporarily stores (or latches) a data bit of the common output line CDOUT in response to the wired-OR enable signal /WOREN. A transfer gate 621 is turned on during the wired-OR period. At this time, the common latch block 620 is enabled to latch a data bit of the common output line CDOUT.

We turn now to describe a program verifying operation in the nonvolatile semiconductor memory device.

Figure 10:
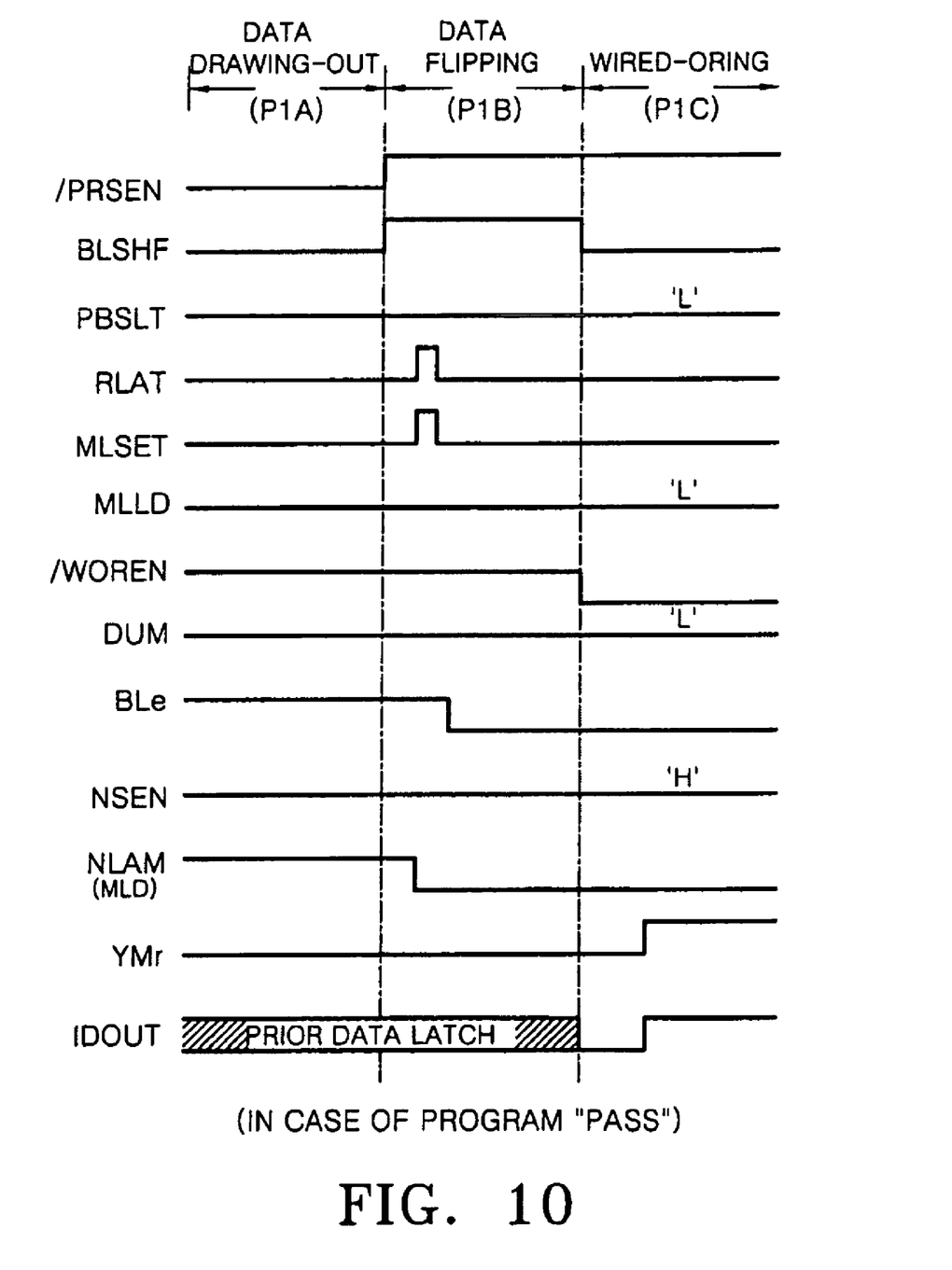
FIG. 10 is a timing diagram of "PASS" signals and voltage at nodes in a program verifying operation.
Figure 11:
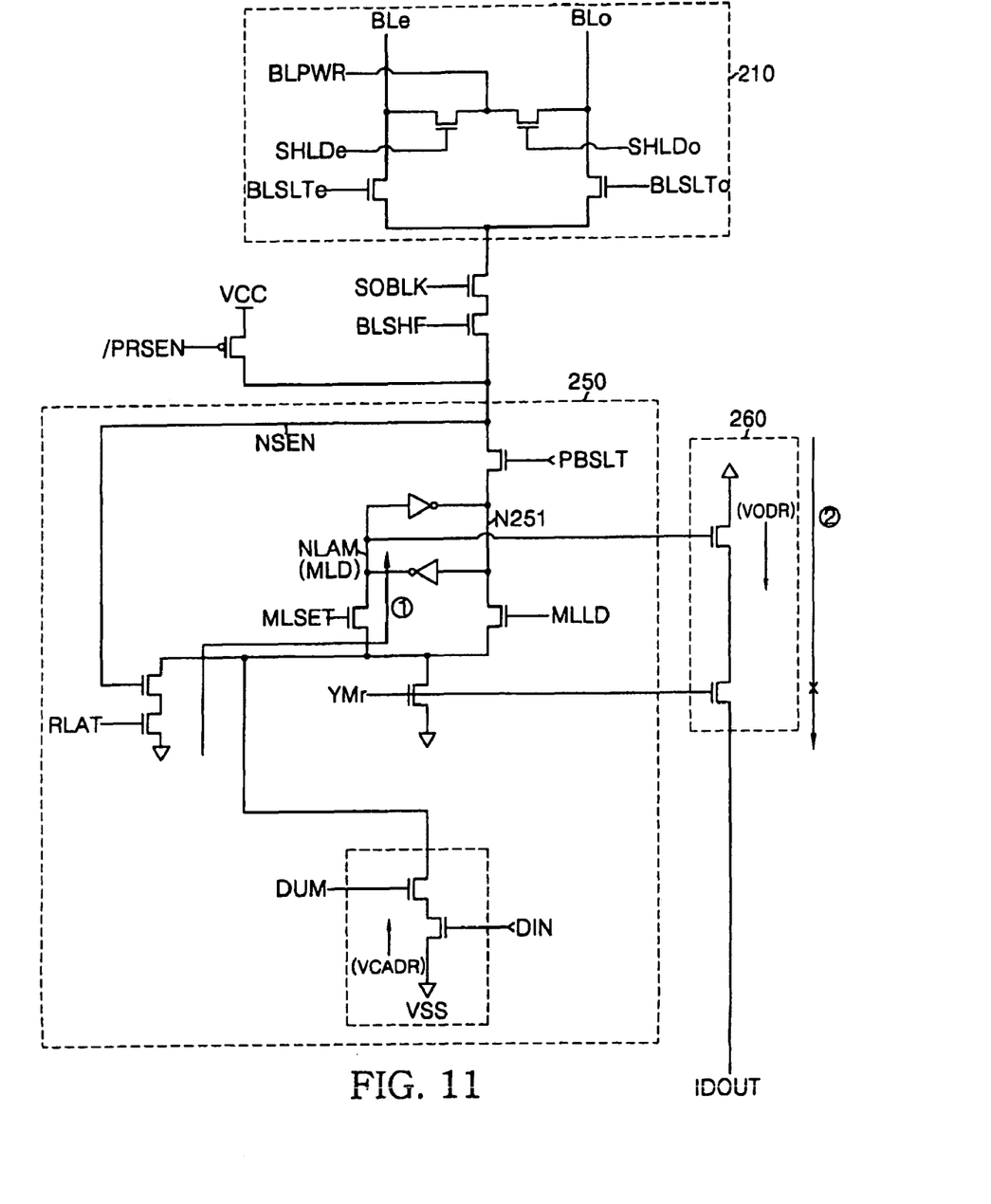
FIG. 11 is a circuit diagram of the data flow during the program verifying operation shown in FIG. 10.

FIG. 10 is a timing diagram showing waveforms of signals and voltages at the nodes during the program verifying operation when a selected memory cell is detected as being successfully programmed (i.e., 'PASS'). FIG. 11 illustrates a data flow in accordance with the verifying operation shown in FIG. 10.

Referring to FIG. 10, in a data drawing-out period P1A, a sensing precharge signal /PRSEN goes to a logic "L" to precharge the sensing node NSEN to the power source voltage VCC. During this time, the main latch data bit MLD has a logic "H." As a selected memory cell is conditioned in the PASS program state, the corresponding bitline BLe or BLo is maintained at its current state.

Because of a high state on a corresponding bit line BLe or BLo, in a data flipping period P1B, even when the bitline shielding signal BLSHF changes to a logic "H," the sensing node NSEN almost keeps the level of the power source voltage VCC. If the read latch signal RLAT and main latch setting signal MLSET become logic "H," the main latch node NLAM flips to a logic "L" from a logic "H" (refer to (1) shown in FIG. 11). Thereafter, even if a node N251 goes to logic "L," the internal output line IDOUT is not driven into the ground voltage VSS (refer to (2) shown in FIG. 11).

In the wired-OR period P1C, the wired-OR enable signal /WOREN is set to a logic "L." During this time, even if the global output line GDOUT is connected to the internal output line IDOUT, the global output line GDOUT remains in a charged state of logic "H". As such, finding the global output line GDOUT is in a logic "H," it verifies that all memory cells MC to be programmed have been successfully programmed as being in the PASS state.

Figure 12:
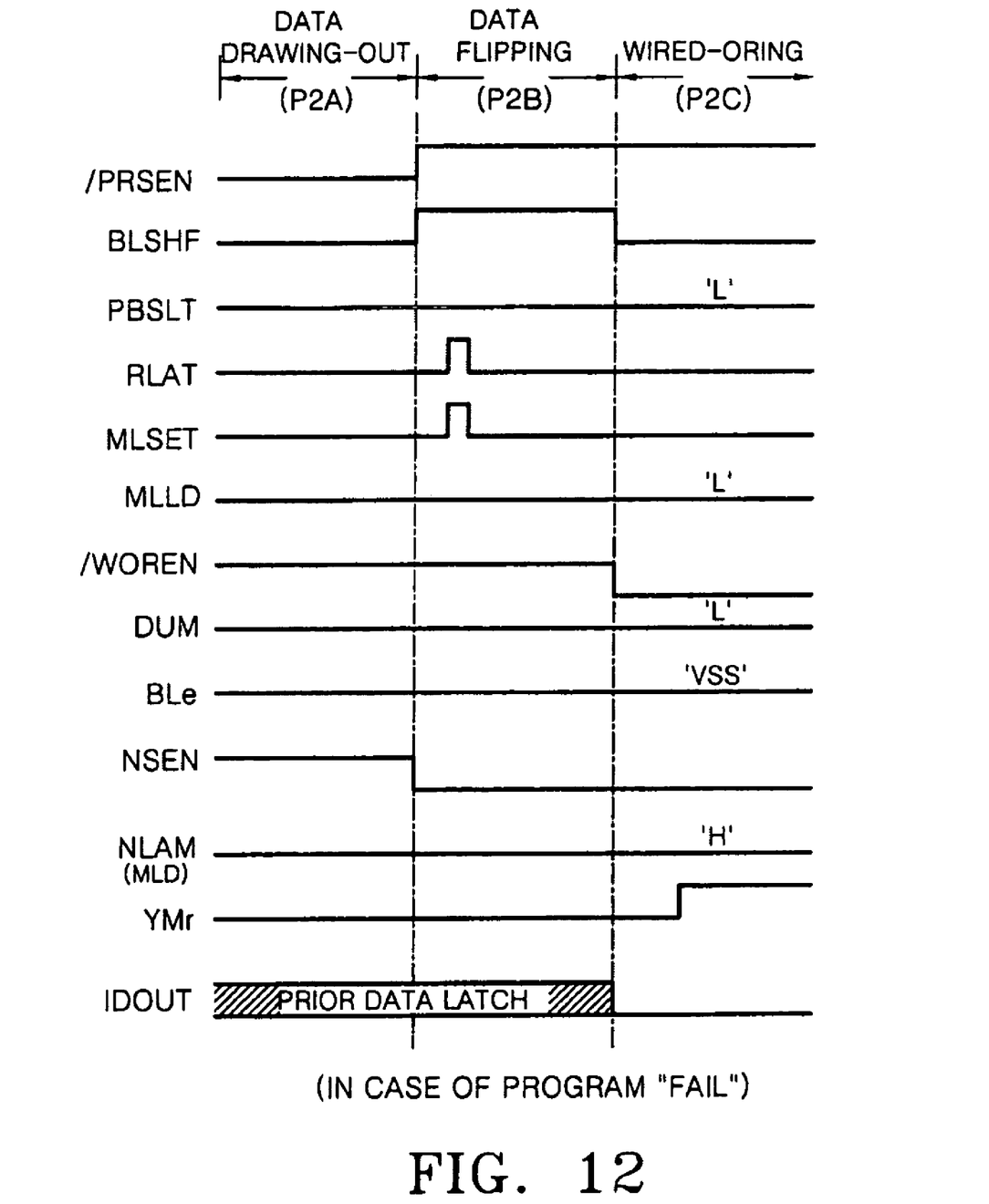
FIG. 12 is a timing diagram of "FAIL" signals and voltage at nodes in a program verifying operation.
Figure 13:
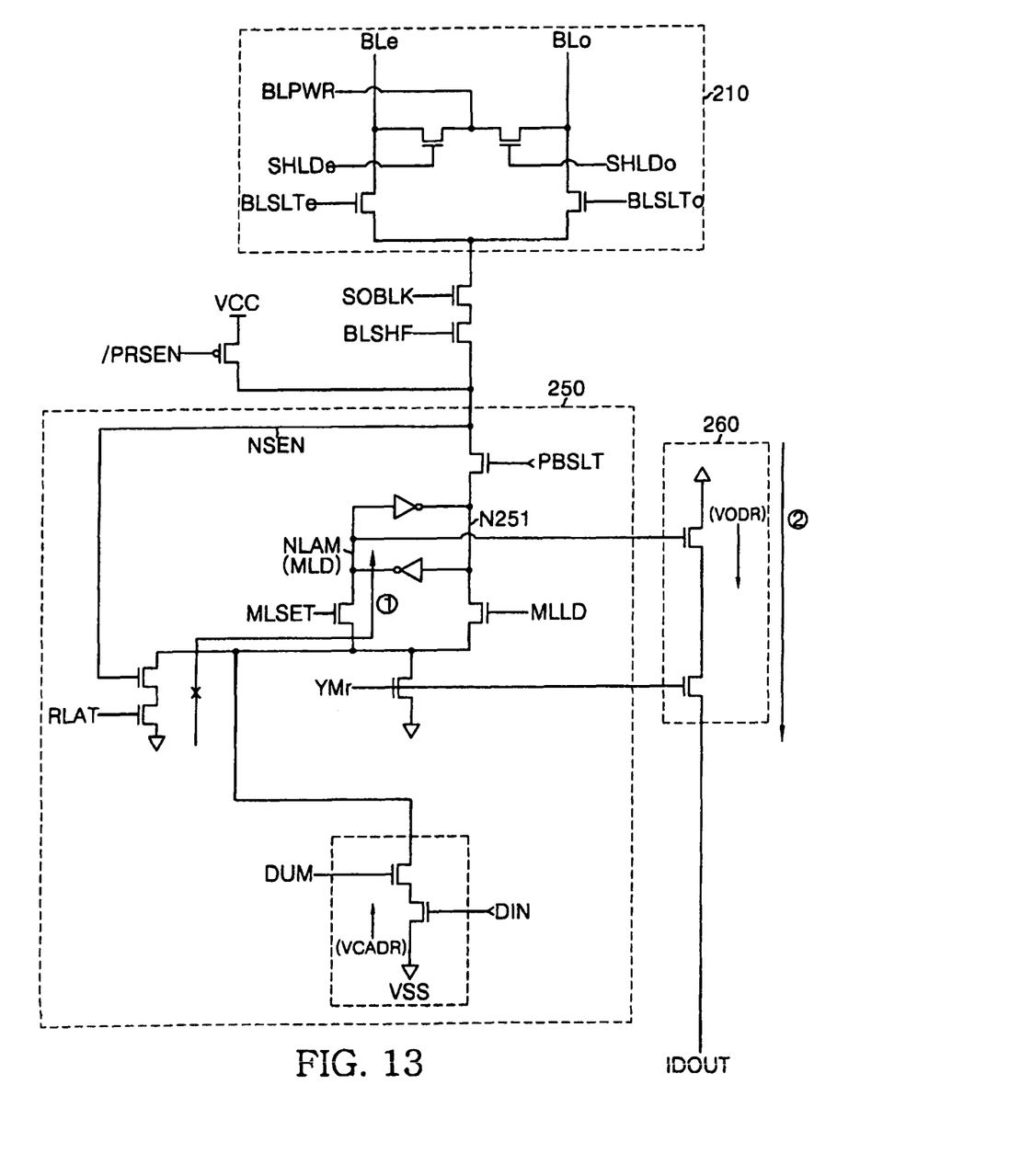
FIG. 13 is a circuit diagram of the data flow during the program verifying operation shown in FIG. 12.

We now describe a program verifying operation when a selected memory cell fails programming. FIG. 12 is a timing diagram showing waveforms of signals and voltages at the nodes during the program verifying operation when a selected memory cell is detected as having failed programming (i.e., 'FAIL'). FIG. 13 illustrates a data flow in accordance with the verifying operation shown in FIG. 12.

Referring to FIG. 12, in a data drawing-out period P2A, the sensing precharge signal /PRSEN is set to a logic "L" to precharge the sensing node NSEN to the power source voltage VCC. During this time, the main latch data bit MLD is at a logic "H." As a selected memory cell is conditioned in the FAIL program state, the bitline BLe or BLo corresponding thereto forms a current path toward the ground voltage VSS.

In a data flipping period P2B, when the bitline shielding signal BLSHF changes to a logic "H," the sensing node NSEN goes to the ground voltage VSS. During this time, if the read latch signal RLAT and main latch setting signal MLSET become logic "H," the main latch node NLAM does not flip, maintaining a logic "H" (refer to (1) shown in FIG. 13). Thus, the internal output line IDOUT is driven into the voltage VODR (refer to (2) shown in FIG. 13).

In the wired-OR period P2C, if the wired-OR enable signal /WOREN is set to a logic "L," the global output line GDOUT is discharged to a state of logic "L." As such, from finding the global output line GDOUT is a logic "L," it verifies that at least one of the memory cells MC has failed programming and is in the FAIL state.

Accordingly, the program verifying operation is implemented as a wired-OR scheme concurrently verifying all the data bits of plural programmed memory cells significantly reducing the operation time.

As described above, an embodiment of the nonvolatile memory device includes an internal output line and a data line pre-charge circuit. The internal output line may be coupled to the output drive voltage VODR by each output driver of each page buffer, whenever a main latch data bit of a page buffers is a logic "H," independent of the logic states of the other main latch data bits in the rest of the page buffers. The data line pre-charge circuit continuously supplies a predetermined current to the global output line after discharging the same. Thus, it is possible to read data for program verification in the pattern of wired-OR, remarkably reducing the time for program verification.

We have described various embodiments illustrated in the accompanying drawings. It will be apparent to those skilled in the art that various substitutions, modifications, and changes may be made without departing from the scope and spirit of the claims.

What is claimed is:

1. A method of operating a semiconductor memory device, comprising:
   precharging each of a plurality of sensing nodes with a precharge voltage;
   coupling a bitline having an associated bitline voltage to each sensing node;
   comparing each of the bitline voltages with the precharge voltage of the corresponding sensing node;
   combining the comparisons; and
   indicating a failure to program in response to the combination,
   wherein combining the comparisons comprises:
   pulling an internal output line to an output drive voltage when the comparing indicates a substantial difference between the bitline voltage and the sensing node corresponding to the internal output line;
   precharging a global output line; and
   coupling the global output line to the internal output line.

2. The method of claim 1, wherein comparing each of the bitline voltages with the precharge voltage of the corresponding sensing node comprises:
   setting a state of a main latch block corresponding to a sensing node in response to a signal on the corresponding sensing node; and
   pulling an internal output line to an output drive voltage in response to the set state of the main latch block.

3. The method of claim 2, wherein setting the main latch block comprises changing the state of the main latch block when the associated bitline voltage and a voltage on the corresponding sensing node are substantially equivalent.

4. The method of claim 2, wherein setting the main latch block comprises preserving the state of the main latch block when the associated bitline voltage and a voltage on the associated sensing node are not substantially equivalent.

5. The method of claim 1, further comprising:
   programming a plurality of data bits in a plurality of memory cells; and
   generating the bitline voltages in response to the data bits stored in the memory cells.

6. A nonvolatile semiconductor memory device comprising:
   means for precharging each of a plurality of sensing nodes with a precharge voltage;
   means for coupling a bitline having an associated bitline voltage to each sensing node;
   means for comparing each of the bitline voltages with the precharge voltage of the corresponding sensing node;
   means for combining the comparisons; and
   means for indicating a failure to program in response to the combination,
   wherein the means for combining the comparisons comprises:
   means for pulling an internal output line to an output drive voltage when the comparing indicates a substantial difference between the bitline voltage and the sensing node corresponding to the internal output line;
   means for precharging a global output line; and
   means for coupling the global output line to the internal output line.

7. The nonvolatile semiconductor memory device of claim 6, the means for comparing each of the bitline voltages with the precharge voltage of the corresponding sensing node comprising:
   means for setting a state of a main latch block corresponding to a sensing node in response to a signal on the corresponding sensing node; and
   means for pulling an internal output line to an output drive voltage in response to the set state of the main latch block.

8. A method of operating a semiconductor memory device, comprising:
   precharging a plurality of sensing nodes with a precharge voltage, the plurality of sensing nodes corresponding to a plurality of page buffers;

coupling bitlines having associated bitline voltages to the plurality of sensing nodes, respectively;

setting states of a plurality of main latch blocks in response to corresponding signals on the plurality of sensing nodes, respectively;

providing output signals from internal output lines of the plurality of page buffers in response to the set states of the plurality of main latch blocks, respectively;

combining the internal output line outputs of the plurality of page buffers; and verifying a program operation of the semiconductor memory device based on the combined internal output line outputs.

9. The method of claim 8, wherein each main latch block provides a first state when the signal on the corresponding sensing node indicates a difference between the bitline voltage and the precharge voltage, and provides a second state when the signal on the corresponding sensing node indicates substantially no difference between the bitline voltage and the precharge voltage.

10. The method of claim 9, wherein providing output signals from the internal output lines comprises pulling each internal output line to an output drive voltage when the associated main latch block provides the first state.

11. The method of claim 10, further comprising:
indicating a failure to program when at least one of the internal output lines is pulled to the output drive voltage.

12. The method of claim 9, wherein providing output signals from the internal output lines comprises not pulling each internal output line to an output drive voltage when the associated main latch block provides the second state.

* * * * *